(12) United States Patent
Hirasawa et al.

(10) Patent No.: US 10,319,892 B2
(45) Date of Patent: Jun. 11, 2019

(54) LIGHT-EMITTING ELEMENT MOUNTING SUBSTRATE AND METHOD FOR MANUFACTURING LIGHT-EMITTING ELEMENT MOUNTING SUBSTRATE

(71) Applicant: IBIDEN CO., LTD., Ogaki (JP)

(72) Inventors: Takahisa Hirasawa, Ogaki (JP); Kiyotaka Tsukada, Ibi-gun (JP)

(73) Assignee: IBIDEN CO., LTD., Ogaki (JP)

( * ) Notice: Subject to any disclaimer, the term of this patent is extended or adjusted under 35 U.S.C. 154(b) by 39 days.

(21) Appl. No.: 15/894,009

(22) Filed: Feb. 12, 2018

(65) Prior Publication Data

US 2018/0233644 A1    Aug. 16, 2018

(30) Foreign Application Priority Data

Feb. 10, 2017   (JP) .................................. 2017-023144

(51) Int. Cl.
*H01L 33/62* (2010.01)
*H01L 33/48* (2010.01)
(Continued)

(52) U.S. Cl.
CPC ............ *H01L 33/62* (2013.01); *H01L 21/486* (2013.01); *H01L 23/481* (2013.01); *H01L 23/528* (2013.01); *H01L 33/486* (2013.01); *H01L 33/60* (2013.01); *H01L 2933/0066* (2013.01); *H05K 1/0204* (2013.01); *H05K 1/0206* (2013.01)

(58) Field of Classification Search
CPC ....... H01L 33/62; H01L 33/60; H01L 33/486; H01L 21/486; H01L 23/528; H01L 23/481; H01L 2933/0066; H05K 1/0204; H05K 1/0206
See application file for complete search history.

(56) References Cited

U.S. PATENT DOCUMENTS

| 4,835,598 | A   | * | 5/1989  | Higuchi | ................ H01L 23/142 |
|           |     |   |         |         | 257/659                      |
| 8,859,908 | B2  | * | 10/2014 | Wang    | ................... H05K 1/0206 |
|           |     |   |         |         | 174/252                      |

(Continued)

FOREIGN PATENT DOCUMENTS

JP    2005-166937 A    6/2005
WO    WO-2015198795 A1  * 12/2015  ............. H01L 33/60

*Primary Examiner* — Steven T Sawyer
*Assistant Examiner* — Paresh H Paghadal
(74) *Attorney, Agent, or Firm* — Oblon, McClelland, Maier & Neustadt, L.L.P.

(57) ABSTRACT

A light-emitting element mounting substrate includes a substrate including insulating resin, a first conductor layer formed on a first surface of the substrate and having an element mounting portion, a second conductor layer formed on a second surface of the substrate on the opposite side of the first surface, metal blocks formed such that the metal blocks are penetrating through the first conductor layer, the substrate and the second conductor layer and positioned in the element mounting portion of the first conductor layer, and through-hole conductors formed adjacent to the metal blocks respectively such that the through-hole conductors electrically connect the first conductor layer and the second conductor layer and that a diameter of each metal block is larger than a diameter of each through-hole conductor.

20 Claims, 6 Drawing Sheets

(51) Int. Cl.
*H01L 23/528* (2006.01)
*H01L 33/60* (2010.01)
*H01L 21/48* (2006.01)
*H01L 23/48* (2006.01)
*H05K 1/02* (2006.01)

(56) References Cited

U.S. PATENT DOCUMENTS

| | | | | |
|---|---|---|---|---|
| 2002/0189853 | A1* | 12/2002 | Hsu | H01L 23/3677 174/252 |
| 2007/0278483 | A1* | 12/2007 | Narita | H01L 33/486 257/40 |
| 2011/0220939 | A1* | 9/2011 | Nakayama | H01L 33/44 257/98 |
| 2013/0248894 | A1* | 9/2013 | Nakamura | H01L 33/486 257/88 |
| 2014/0251658 | A1* | 9/2014 | Lin | H05K 1/0206 174/252 |
| 2016/0007468 | A1* | 1/2016 | Tomikawa | H05K 1/0204 174/260 |
| 2016/0037620 | A1* | 2/2016 | Kang | H01L 23/3677 361/711 |

* cited by examiner

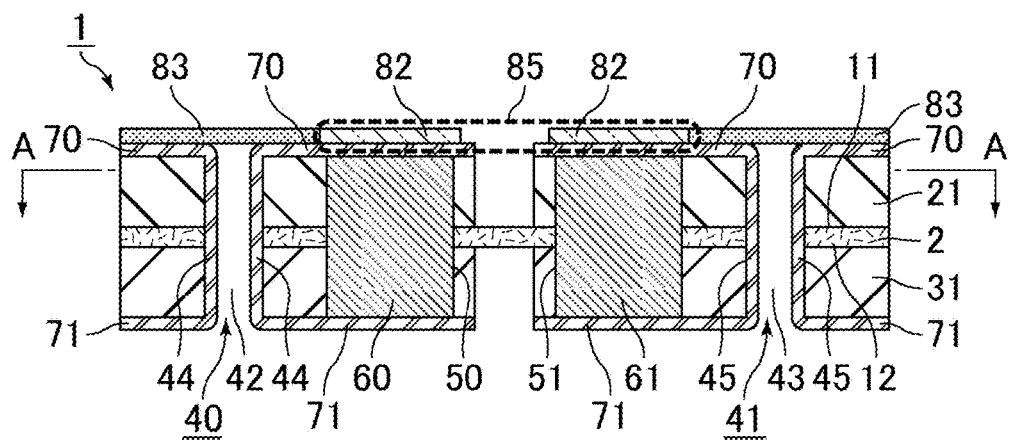
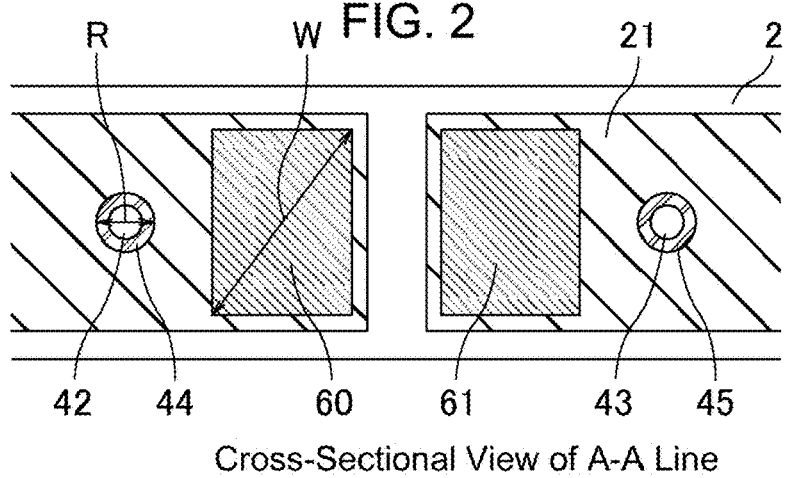
Cross-Sectional View of A-A Line
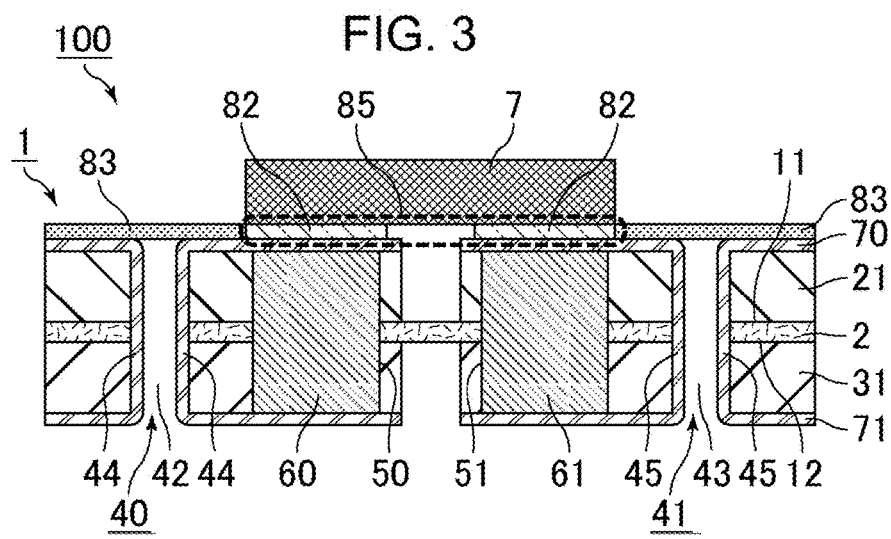

LIGHT-EMITTING ELEMENT MOUNTING SUBSTRATE AND METHOD FOR MANUFACTURING LIGHT-EMITTING ELEMENT MOUNTING SUBSTRATE

CROSS-REFERENCE TO RELATED APPLICATIONS

The present application is based upon and claims the benefit of priority to Japanese Patent Application No. 2017-023144, filed Feb. 10, 2017, the entire contents of which are incorporated herein by reference.

BACKGROUND OF THE INVENTION

Field of the Invention

The present invention relates to a light-emitting element mounting substrate and a method for manufacturing the light-emitting element mounting substrate.

Description of Background Art

Japanese Patent Laid-Open Publication No. 2005-166937 describes a light-emitting element mounting substrate based on a printed wiring board. The entire contents of this publication are incorporated herein by reference.

SUMMARY OF THE INVENTION

According to one aspect of the present invention, a light-emitting element mounting substrate includes a substrate including insulating resin, a first conductor layer formed on a first surface of the substrate and having an element mounting portion, a second conductor layer formed on a second surface of the substrate on the opposite side of the first surface, metal blocks formed such that the metal blocks are penetrating through the first conductor layer, the substrate and the second conductor layer and positioned in the element mounting portion of the first conductor layer, and through-hole conductors formed adjacent to the metal blocks respectively such that the through-hole conductors electrically connect the first conductor layer and the second conductor layer and that a diameter of each metal block is larger than a diameter of each through-hole conductor.

According to another aspect of the present invention, a method for manufacturing a light-emitting element mounting substrate includes preparing a double-sided conductor substrate including a substrate including insulating resin, a first conductor layer formed on a first surface of the substrate, and a second conductor layer formed on a second surface of the substrate on the opposite side of the first surface, forming positioning holes in the double-sided conductor substrate such that each of the positioning holes penetrates through the first conductor layer, the substrate and the second conductor layer, forming holes such that each of the holes penetrates through the first conductor layer, the substrate and the second conductor layer and has a diameter that is larger than a diameter of each positioning hole, inserting metal blocks into the holes respectively using the positioning holes as reference positions such that the metal blocks fill in the holes, and applying metal plating to the positioning holes such that through-hole conductors are formed in the positioning holes respectively and electrically connect the first conductor layer and the second conductor layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 is a cross-sectional view schematically illustrating a light-emitting element mounting substrate according to an embodiment of the present invention;

FIG. 2 is a top view when the light-emitting element mounting substrate illustrated in FIG. 1 is cut along an A-A line and is viewed from above;

FIG. 3 is a cross-sectional view schematically illustrating a light-emitting device in which a light-emitting element is mounted on a light-emitting element mounting substrate according to an embodiment of the present invention;

DETAILED DESCRIPTION OF THE EMBODIMENTS

Figure 4:
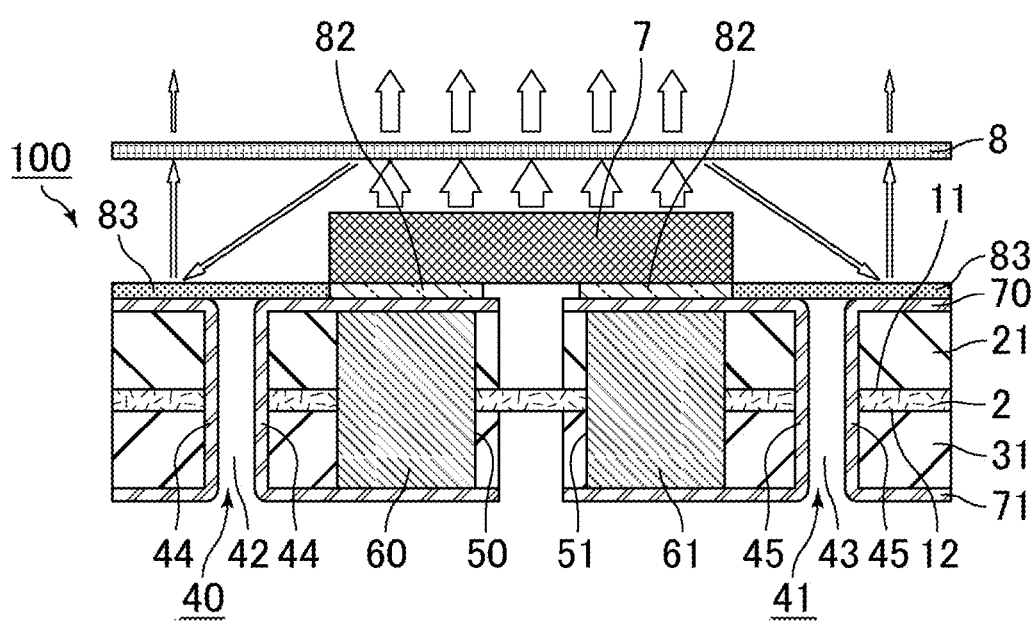
FIG. 4 schematically describes an effect of a light-reflecting layer.

Embodiments will now be described with reference to the accompanying drawings, wherein like reference numerals designate corresponding or identical elements throughout the various drawings.

In the following, a structure of a light-emitting element mounting substrate according to an embodiment of the present invention is further described in detail.

FIG. 1 is a cross-sectional view schematically illustrating a light-emitting element mounting substrate according to an embodiment of the present invention.

As illustrated in FIG. 1, a light-emitting element mounting substrate 1 includes a substrate 2 that is formed from an insulating resin and has a first main surface 11 and a second main surface 12 (that is on an opposite side of the first main surface 11), a first conductor layer 21 that is formed on the first main surface 11 of the substrate 2, and a second conductor layer 31 that is formed on the second main surface 12 of the substrate 2.

The light-emitting element mounting substrate 1 further includes a hole 50 and a hole 51 that penetrate the first conductor layer 21, the substrate 2 and the second conductor layer 31, a metal block 60 inserted in the hole 50, and a metal block 61 inserted in the hole 51.

In the light-emitting element mounting substrate, the insulating resin that forms the substrate is not particularly limited, but is preferably a flexible insulating resin. Examples of a material that forms such an insulating resin include polyimide, glass epoxy and the like. Among these materials, polyimide is preferred. When the insulating resin is polyimide, the insulating resin is both flexible and insulating. Therefore, a shape is deformed according to an intended use, while sufficient insulation is ensured.

A thickness of the substrate is not particularly limited, but is preferably 30-70 µm. When the thickness of the substrate is smaller than 30 µm, the substrate easily bends. Further, since the substrate easily bends, bonding of the substrate with a wiring or a light-emitting element is easily broken. On the other hand, when the thickness of the substrate is larger than 70 µm, when a hole is formed by punching in order to insert a metal block, a crack is likely to occur around the hole and reliability may decrease.

A material that forms the first conductor layer and the second conductor layer of the light-emitting element mounting substrate is not particularly limited, but is preferably copper, nickel or the like. These materials have good electrical conductivity and are suitably used as conductors.

Thicknesses of the first conductor layer and the second conductor layer are not particularly limited. However, the first conductor layer and the second conductor layer are preferably each thicker than the substrate. Further, the thicknesses of the first conductor layer and the second conductor layer are preferably each 10-300 µm. When the thicknesses of the first conductor layer and the second conductor layer are each smaller than 10 µm, during handling, the conductor layers may be easily broken and a failure rate may increase. On the other hand, when the thicknesses of the first conductor layer and the second conductor layer are greater than 300 µm, when the light-emitting element mounting substrate is bent and used, due to the bending, a compressive stress applied from the conductor layers to the substrate is increased and thus the substrate may be easily broken.

The light-emitting element mounting substrate has the metal blocks that penetrate the first conductor layer, the substrate and the second conductor layer.

The metal blocks are different from filled vias that are formed in through holes through a chemical process such as plating. There are no voids formed inside the metal blocks and there are no concave or convex portions or the like on surfaces of the metal blocks. Since there are no voids formed inside the metal blocks, heat-transfer efficiency of the metal blocks is not reduced and heat dissipation performance of the metal blocks is ensured. Further, the metal blocks are also preferable in that a conductor volume thereof is easily increased as compared to filled vias.

A material for forming the metal blocks is not particularly limited, but is preferably copper that is excellent in electrical conductivity and thermal conductivity.

Further, a front end portion of a surface of each of the metal blocks on the first conductor layer side is preferably a flat surface.

When the front end portion of the surface on the first conductor layer side is a flat surface, a light-emitting element that is mounted when the front end portion is used as a pad is prevented from being inclined.

Further, it is preferable that the front end portion of the surface of each of the metal blocks on the first conductor layer side and a surface of the first conductor layer form the same plane. When the front end portion of the surface of each of the metal blocks on the first conductor layer side and the surface of the first conductor layer form the same plane, lateral deviation during mounting of a light-emitting element is suppressed and mounting accuracy is improved.

A through-hole conductor 40 is provided adjacent to the metal block 60. The through-hole conductor 40 is formed from a positioning hole 42 and a through-hole plating 44 that is formed on a wall surface of the positioning hole 42.

Further, a through-hole conductor 41 is provided adjacent to the metal block 61. The through-hole conductor 41 is also formed from a positioning hole 43 and a through-hole plating 45 that is formed on a wall surface of the positioning hole 43.

That is, the through-hole conductor 40 and the through-hole conductor 41 are respectively provided adjacent to the metal block 60 and the metal block 61.

Further, the through-hole conductor 40 and the through-hole conductor 41 both electrically connect the first conductor layer 21 and the second conductor layer 31.

The light-emitting element mounting substrate has the through-hole conductors that are respectively adjacent to the metal blocks and electrically connect the first conductor layer and the second conductor layer.

Due to the through-hole conductors, electrical connection between the front and back sides of the substrate is ensured.

When a through-hole conductor and a metal block are adjacent to each other, the through-hole conductor and the metal block are preferably at the same potential. Being at the same potential is substantially synonymous with that the through-hole conductor and the metal block are adjacent to each other.

Further, a distance between the adjacent through-hole conductor and metal block is preferably 1-10 mm. When the light-emitting element mounting substrate is viewed from above, the distance between the through-hole conductor and the metal block is measured as a length of a shortest straight line that is drawn between the through-hole conductor and the metal block.

Figure 5:
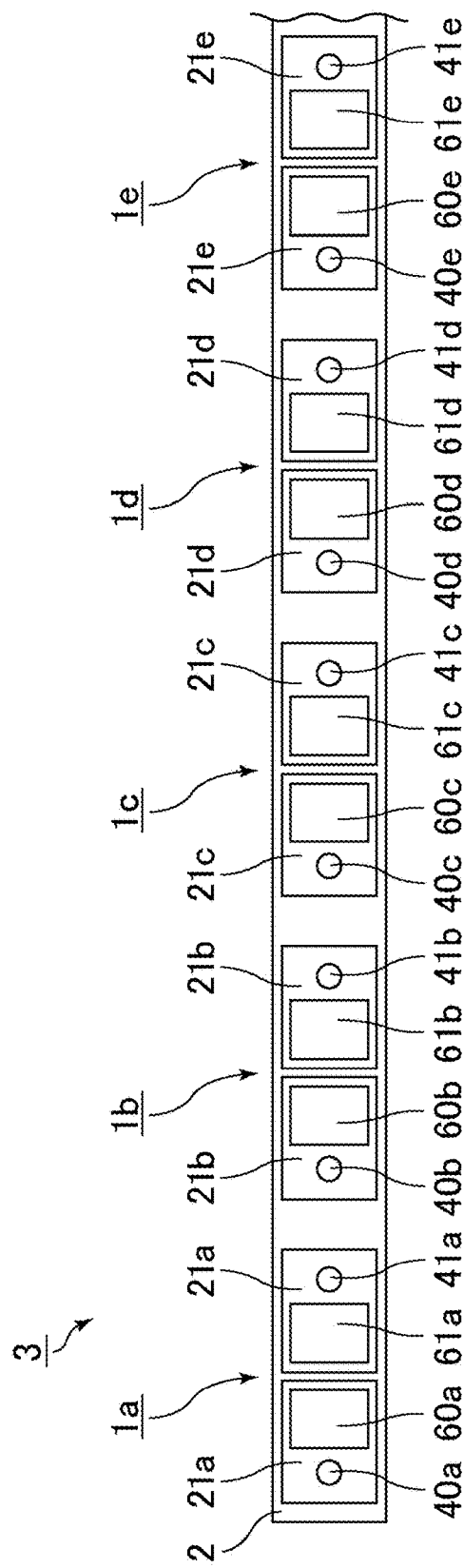
FIG. 5 is a top view schematically illustrating a light-emitting element mounting substrate according to an embodiment of the present invention, in which multiple element mounting parts are provided.

Further, with respect to one metal block, it is possible that one through-hole conductor is provided, or two or more through-hole conductors are provided, adjacent to the metal block. An example of the case where one through-hole conductor is provided with respect to one metal block is an embodiment in which, as illustrated in FIG. 5 (to be described later), when the light-emitting element mounting substrate is viewed from above, a through-hole conductor is positioned between pitches of metal blocks straddling an element mounting part. Examples of the case where multiple through-hole conductors are provided with respect to one metal block include an embodiment in which a total of four through-hole conductors, including two through-hole conductors formed for each one metal block, are positioned between pitches of metal blocks straddling an element mounting part, and an embodiment in which, assuming that a metal block has a rectangular shape when viewed from above, a total of three through-hole conductors are provided at positions that are respectively adjacent to three sides of a metal block other than one side that opposes another metal block positioned at the same element mounting part.

A through-hole conductor in the light-emitting element mounting substrate is preferably formed in a positioning hole that positions a metal block.

When the light-emitting element mounting substrate is manufactured, a positioning hole as a reference for determining a position at which a metal block is inserted is additionally required.

By incorporating a positioning hole as a part of the light-emitting element mounting substrate and forming a through-hole conductor in the positioning hole, it is not necessary to additionally secure a place for the positioning hole in a substrate as a raw material, and thus the number of light-emitting element mounting substrates formed from the substrate as a raw material is increased. Further, it is possible to have a light-emitting element mounting substrate for which a positional relation between a through-hole conductor and a metal block is the same in any substrate.

In the light-emitting element mounting substrate, a diameter of each of the metal blocks is larger than a diameter of each of the through-hole conductors. The diameter of each of the metal blocks and the diameter of each of the through-hole conductors are described with reference to FIG. 2.

FIG. 2 is a top view when the light-emitting element mounting substrate illustrated in FIG. 1 is cut along an A-A line and is viewed from above.

In this top view, the metal blocks and the through-hole conductors are exposed. A top view shape of each of the metal blocks is a rectangle, and a shape of each of the through-hole conductors is circular.

The diameter of each of the metal blocks is a length represented by a double arrow (W) in FIG. 2, which is a length of a diagonal line of the rectangle. The diameter of each of the through-hole conductors is a length represented by a double arrow (R) in FIG. 2, which is a diameter of a circle.

The diameter of each of the through-hole conductors is measured starting from an outer side of a conductor portion of each of the through-hole conductors.

As illustrated in FIG. 2, the diameter (W) of each of the metal blocks is larger than the diameter (R) of each of the through-hole conductors.

Specific examples include that a shape of each of the metal blocks is a 1.2 mm×1.6 mm rectangle (the diameter (W) of each of the metal blocks is a length of a diagonal line, which is 2.0 mm), and a shape of each of the through-hole conductors is a circle of a diameter of 0.5 mm (the diameter (R) of each of the through-hole conductors is a diameter of 0.5 mm).

The top view shape of each of the metal blocks and the top view shape of each of the through-hole conductors are not respectively limited to the shapes illustrated in FIG. 2.

Examples of the top view shape of each of the metal blocks include a substantially circular shape, a substantially elliptical shape, and a substantially polygonal shape (a substantially quadrangular shape, a substantially pentagonal shape, a substantially hexagonal shape, a substantially octagonal shape, and the like). A substantially quadrangular shape is preferable. Among substantially quadrangular shapes, a substantially rectangular shape and a substantially square shape are more preferable.

Further, examples of the top view shape of each of the through-hole conductors include a substantially circular shape, a substantially elliptical shape, and a substantially polygonal shape (a substantially quadrangular shape, a substantially pentagonal shape, a substantially hexagonal shape, a substantially octagonal shape, and the like). A substantially circular shape is preferable.

A substantially circular shape, a substantially elliptical shape, or a substantially polygonal shape, as the top view shape of each of the metal blocks or each of the through-hole conductors, means that the shape is not limited to a circle, an ellipse, or a polygon in a strict sense. Substantially circular shapes include not only a circle but also a shape formed by slightly distorting a circle. Substantially polygonal shapes also include a polygonal shape of which corners are slightly rounded. Further, substantially rectangular or substantially square shapes include, in addition to strict rectangular or square shapes, also shapes having sides slightly different in length and angle.

A method for determining the diameter of each of the metal blocks or the diameter of each of the through-hole conductors differs depending on the top view shape thereof.

When the top view shape is a circular or substantially circular shape, the diameter of each of the metal blocks or the diameter of each of the through-hole conductors is determined based on a diameter of the circular or substantially circular shape. When the top view shape is an elliptical or substantially elliptical shape, the diameter of each of the metal blocks or the diameter of each of the through-hole conductors is determined based on a long diameter of the elliptical or substantially elliptical shape.

When the top view shape is a polygonal or substantially polygonal shape, the diameter of each of the metal blocks or the diameter of each of the through-hole conductors is determined based on a length of a longest diagonal line of the polygonal or substantially polygonal shape.

A larger diameter of each of the metal blocks means a larger conductor volume of each of the metal blocks.

In the light-emitting element mounting substrate, a larger conductor volume of each of the metal blocks leads to better heat dissipation performance and thus is preferable.

On the other hand, from a point of view of saving space in the substrate, it is not necessary for the diameter of each of the through-hole conductors to be larger than necessary as long as conduction between the front and back sides of the substrate is ensured.

Therefore, by making the diameter of each of the metal blocks larger than the diameter of each of the through-hole conductors, a light-emitting element mounting substrate is obtained that is preferable from a point of view of ensuring heat dissipation performance and saving space in the substrate.

A ratio of the diameter of each of the metal blocks to the diameter of each of the through-hole conductors ((the diameter of each of the metal blocks)/(the diameter of each of the through-hole conductors)) is preferably 1.5-7.5, and more preferably 2.5-5.5.

Further, the diameter of each of the through-hole conductors is preferably 0.2-1.0 mm.

Further, the diameter of each of the metal blocks is preferably 0.3-4.0 mm.

A ratio of the conductor volume of each of the metal blocks to the conductor volume of each of the through-hole conductors ((the conductor volumes of each of the metal blocks)/(the conductor volume of each of the through-hole conductors)) is preferably 10 or more.

In the light-emitting element mounting substrate, a larger conductor volume of each of the metal blocks leads to better heat dissipation performance and thus is preferable. On the other hand, from a point of view of saving space in the substrate, it is not necessary for the conductor volume of each of the through-hole conductors to be larger than necessary as long as conduction between the front and back sides of the substrate is ensured. From the above-described circumstances, when the ratio of the conductor volume of each of the metal blocks to the conductor volume of each of the through-hole conductors ((the conductor volume of each of the metal blocks)/(the conductor volume of each of the through-hole conductors)) is 10 or more, a light-emitting element mounting substrate is obtained that is preferable from a point of view of ensuring heat dissipation performance and saving space in the substrate.

The through-hole conductors are each a conductor formed on an inner wall of a hole (for example, a positioning hole) provided in the substrate. The through-hole conductors each have a hollow shape. Therefore, the conductor volume of each of the through-hole conductors is smaller than a volume of the hole provided in the substrate.

On the other hand, the metal blocks are each inserted into a hole provided in the substrate so as to fill the entire hole. Therefore, the volume of each of the metal blocks is substantially the same as a volume of the hole provided in the substrate.

Therefore, the ratio of the conductor volume of each of the metal blocks to the conductor volume of each of the through-hole conductors is larger than the ratio of the diameter of each of the metal blocks to the diameter of each of the through-hole conductors.

In the light-emitting element mounting substrate, it is preferable that a metal plating layer be provided on surfaces of the metal blocks on the first conductor layer side and on a surface of the first conductor layer. Further, it is preferable to form a light-reflecting layer on an outermost surface on the first conductor layer side such that the element mounting part is exposed.

These structures are described again with reference to FIG. 1.

In the light-emitting element mounting substrate 1 illustrated in FIG. 1, a metal plating layer 70 is formed on surfaces of the metal block 60 and the metal block 61 on the first conductor layer 21 side and on a surface of the first conductor layer 21. In a portion that becomes a mounting pad on the metal plating layer 70, a gold plating layer 82 is provided as a gold layer on the metal plating layer 70.

The portion where the gold plating layer 82 is formed is the mounting pad. Since a light-emitting element is mounted on the mounting pad, a region including a predetermined area that includes the mounting pad, that is, a portion directly below the light-emitting element when the light-emitting element is mounted, is an element mounting part 85 (a portion surrounded by a dotted line in FIG. 1).

A light-reflecting layer 83 is provided on an outermost surface on the first conductor layer 21 side such that the element mounting part 85 is exposed.

Further, a metal plating layer 71 is formed on surfaces of the metal block 60 and the metal block 61 on the second conductor layer 31 side and on a surface of the second conductor layer 31.

A front end portion of a surface of each of the metal blocks on the first conductor layer side is used as a mounting pad for a light-emitting element, and an electrode of the light-emitting element is positioned on the front end portion.

When the surface of each of the metal blocks is used as a mounting pad, the surface of each of the metal blocks may be used as an outermost surface of the mounting pad, and it is also possible to have a mounting pad that is formed by forming a conductor layer such as a metal plating layer or a gold plating layer on the surface of each of the metal blocks.

Multiple metal blocks are provided with respect to one element mounting part. It is preferable to provide two metal blocks including one cathode side metal block and one anode side metal block with respect to one element mounting part.

In this case, the cathode side metal block and the anode side metal block may be electrically insulated from each other. Further, since multiple metal blocks are provided with respect to one element mounting part, heat generated in the element mounting part is efficiently dissipated to a surface on an opposite side of the element mounting part.

Further, separate through-hole conductors are respectively provided adjacent to the multiple metal blocks that are provided with respect to the element mounting part. Due to the through-hole conductors, electrical connection between the front and back sides of the substrate is ensured.

Heat dissipation from the element mounting part is ensured by the metal blocks, and electrical connection between the front and back sides is ensured by the through-hole conductors. Therefore, due to the both effects, a highly reliable substrate is obtained.

A material that forms the light-reflecting layer is not particularly limited, but is preferably an insulating layer that contains titanium oxide as a pigment, and is more preferably a solder resist layer that contains titanium oxide as a pigment. Titanium oxide is a white pigment. The light-reflecting layer containing titanium oxide is suitably reflect light. When the light-reflecting layer is a solder resist layer containing titanium oxide as a pigment, in addition to the above effect, the light-reflecting layer 51 also functions as a solder resist at the same time.

A thickness of the light-reflecting layer is preferably 50-300 μm. When the thickness of the light-reflecting layer is smaller than 50 μm, thermal deterioration due to heat generated from the light-emitting element may progress and a crack or a defect may occur. On the other hand, when the thickness of the light-reflecting layer is larger than 300 μm, when the substrate is bent and used, it is possible that the light-reflecting layer does not follow deformation due to the bending and a crack occurs.

In the light-emitting element mounting substrate, it is preferable to form a metal plating layer on the surfaces of the metal blocks on the first conductor layer side and on the surface of the first conductor layer. Further, it is preferable to form a metal plating layer on the surfaces of the metal blocks on the second conductor layer side and on the surface of the second conductor layer.

It is preferable to form the metal plating layers so as to cover the surfaces of the metal blocks on the first conductor layer side and the surface of the first conductor layer and to cover the surfaces of the metal blocks on the second conductor layer side and the surface of the second conductor layer.

When the metal plating layers are formed so as to cover the surfaces of the metal blocks on the first conductor layer side and the surface of the first conductor layer and to cover the surfaces of the metal blocks on the second conductor layer side and the surface of the second conductor layer, the metal plating layers fix the metal blocks, and it is possible to make the metal blocks less likely to pop out from the holes.

The metal plating layers are preferably formed of at least one metal selected from a group of copper, nickel and solver. When the metal plating layers are formed of copper, the metal plating layers are formed at the same time as the through-hole plating that forms the through-hole conductors.

Further, when the metal plating layers are formed of nickel or silver, the metal blocks, the first conductor layer and the second conductor layer are protected from corrosion.

Further, the metal plating layers are preferably each a layer that is formed by forming a nickel plating layer and/or a silver plating layer on a copper plating layer.

Further, a thickness of each of the metal plating layers is not particularly limited, but is preferably 1.0-10 μm.

When the thickness of each of the metal plating layers is smaller than 1.0 μm, during handling, the conductor layers may easily break and failure rate may increase. On the other hand, when the thickness of each of the metal plating layers is greater than 10 μm, when the light-emitting element mounting substrate is bent and used, due to the bending, a compressive stress applied from the metal plating layers and the conductor layers is increased and thus the substrate may be easily broken.

In a light-emitting element mounting substrate according to an embodiment of the present invention, it is preferable to provide a gold plating layer as a gold layer on the metal plating layer in a portion that becomes a mounting pad on the front end portion of the surface of each of the metal blocks on the first conductor layer side.

When the outermost surface of the mounting pad is a gold plating layer, gold is prevent oxidation of the metal plating layer.

Further, a thickness of the gold layer is not particularly limited, but is preferably 0.5-3.0 μm.

Further, instead of the gold layer, it is also possible to form a tin layer.

When the thickness of the gold layer or the tin layer is smaller than 0.5 μm, since the thickness is too small, oxidation is not prevented. On the other hand, since gold and tin are soft metals, the gold layer or the tin layer may be easy to be deformed. Therefore, when the thickness of the gold layer or the tin layer is larger than 3.0 μm, when the gold layer or the tin layer deforms, the gold layer or the tin layer spreads to surrounding areas and a compressive stress is generated, which becomes a cause for a failure such as peeling.

FIG. 3 is a cross-sectional view schematically illustrating an example of a light-emitting device in which a light-emitting element is mounted on a light-emitting element mounting substrate according to an embodiment of the present invention.

FIG. 3 illustrates a light-emitting device 100 in which a light-emitting element 7 is mounted on the light-emitting element mounting substrate 1 illustrated in FIG. 1.

Electrodes of the light-emitting element 7 are each electrically connected to a mounting pad that is formed by forming the gold plating layer 82 on the outermost surface. The portion directly below the light-emitting element 7 is the element mounting part. In portions other than the element mounting part, the light-reflecting layer 83 is exposed.

As the light-emitting element, an LED (light-emitting diode) element or an LD (laser diode) may be used. The light-emitting element is preferably a surface-mounting type element.

The surface-mounting type light-emitting element allows a mounting density to be increased. Therefore, when multiple light-emitting elements are mounted on the light-emitting element mounting substrate, brightness of light emitted from the light-emitting device is increased.

The electrodes of the light-emitting element are each electrically connected to a mounting pad. An outermost surface of each of the electrodes of the light-emitting element is preferably a gold layer or a tin layer.

A method for connecting the electrodes of the light-emitting element and the mounting pads is not particularly limited. For example, the electrodes and the mounting pads may be connected using solder (not illustrated in the drawings).

In the case where an outermost surface of a mounting pad is formed of a gold plating layer, when a tin layer is formed on a surface of an electrode of the light-emitting element, the light-emitting element and the mounting pad may be connected by eutectic connection of gold and tin.

FIG. 4 schematically describes an effect of the light-reflecting layer.

The light-emitting device 100 in which the light-emitting element 7 is mounted on the light-emitting element mounting substrate 1 is covered by a transparent cover 8 for a purpose of protecting the light-emitting device.

As illustrated in FIG. 4, in the light-emitting device 100 having the light-reflecting layer 83, when the light-emitting element 7 emits light, most of the light transmit through the cover 8. However, a portion of the light is reflected by the cover 8 (in FIG. 4, directions of arrows indicate directions along which light propagates, and a thickness of each of the arrows indicates an amount of light). When the light-reflecting layer is formed in the light-emitting element mounting substrate, the reflected light is re-reflected. Therefore, brightness is increased.

A material that forms the cover 8 is not particularly limited, is preferably an acrylic resin (PMMA), polycarbonate (PC), glass, or the like.

FIG. 5 is a top view schematically illustrating an example of a light-emitting element mounting substrate in which multiple element mounting parts are provided.

FIG. 5 illustrates a top view of a light-emitting element mounting substrate 3 as viewed from the first conductor layer 21 side, multiple element mounting parts being provided in the light-emitting element mounting substrate 3, and the structures (the metal plating layer 70, the gold plating layer 82 and the light-reflecting layer 83) illustrated above the first conductor layer 21 in FIG. 1 being omitted in FIG. 5. Therefore, the first conductor layer 21, the metal block 60, the metal block 61, the through-hole conductor 40, the through-hole conductor 41 and a portion of the substrate 2 are exposed and visible.

On a leftmost side in FIG. 5, a first conductor layer (21a), a metal block (60a) and a metal block (61a) corresponding to one element mounting part are illustrated, and a through-hole conductor (40a) adjacent to the metal block (60a) and a through-hole conductor (41a) adjacent to the metal block (61a) are illustrated. One unit that includes the first conductor layer (21a), the metal block (60a), the metal block (61a), the through-hole conductor (40a) and the through-hole conductor (41a) may be considered as a light-emitting element mounting substrate (1a) in which one element mounting part is provided. To the right of the light-emitting element mounting substrate (1a), one unit that includes a first conductor layer (21b), a metal block (60b), a metal block (61b), a through-hole conductor (40b) and a through-hole conductor (41b) may be considered as a light-emitting element mounting substrate (1b) in which one element mounting part is provided. In the same way, light-emitting element mounting substrates (1c-1e) may be considered as respectively including first conductor layers (21c-21e), through-hole conductors (40c-40e), through-hole conductors (41c-41e), metal blocks (60c-60e) and metal blocks (61c-61e), and as a whole, the light-emitting element mounting substrate 3 in which multiple element mounting parts are provided is formed.

In the light-emitting element mounting substrate 3, between the metal block (61a) (which is a metal block that is provided with respect to the element mounting part on the left end) and the metal block (60b) (which is a metal block that is provided with respect to an adjacent element mounting part), the through-hole conductor (41a) (which is a through-hole conductor that is adjacent to the metal block (61a)) and the through-hole conductor (40b) (which is a through-hole conductor that is adjacent to the metal block (60b)) are provided.

That is, a light-emitting element mounting substrate according to an embodiment of the present invention may include multiple element mounting parts, and a light-emitting element may be mounted on each of the element mounting parts.

Multiple metal blocks are provided with respect to each of the element mounting parts, and a through-hole conductor is provided adjacent to each of the metal blocks.

For diameters of each metal block and an adjacent through-hole conductor, the diameter of the metal block is larger than the diameter of the through-hole conductor.

And, between a metal block that is provided with respect to one element mounting part and a metal block that is provided with respect to another element mounting part, through-hole conductors that are respectively adjacent to the metal blocks are preferably provided.

The above-described substrate is a so-called multi-piece substrate in which multiple element mounting parts are provided in one substrate. In this substrate, a through-hole conductor is provided between pitches of metal blocks straddling an element mounting part.

Since the metal blocks and the through-hole conductors are provided with respect to each of the element mounting parts that are provided at multiple places, heat dissipation performance with respect to each of the element mounting parts is ensured by the metal blocks, and electrical connection between front and back sides of portions adjacent to the metal blocks is ensured by the through hole conductors, and thus a preferred multi-piece substrate is obtained.

In the following, processes of a method for manufacturing a light-emitting element mounting substrate according to an embodiment of the present invention are described using the drawings. FIG. 6A-6D are process diagrams schematically illustrating an example of a method for manufacturing a light-emitting element mounting substrate according to an embodiment of the present invention.

(1) Double-Sided Conductor Substrate Preparation Process

Figure 6A:
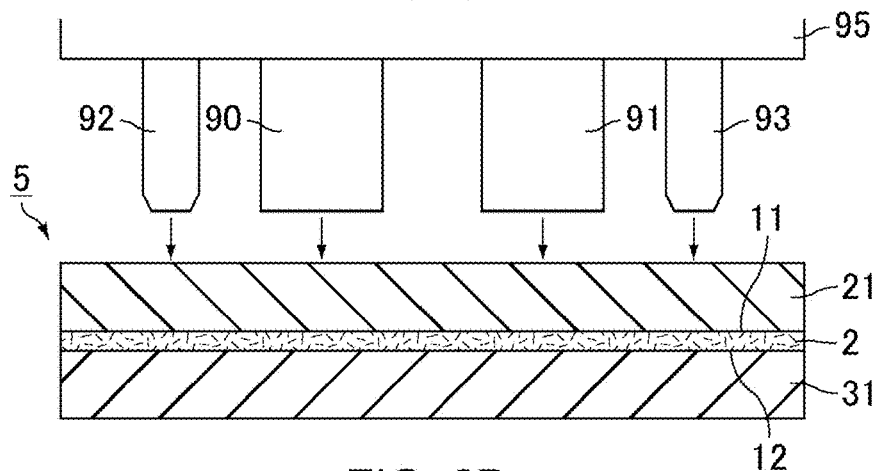
FIG. 6A-6D are process diagrams schematically illustrating a method for manufacturing a light-emitting element mounting substrate according to an embodiment of the present invention.

First, as illustrated in FIG. 6A, a double-sided conductor substrate 5 is prepared, in which a first conductor layer 21 is formed on a first main surface 11 of a substrate 2 and a second conductor layer 31 is formed on a second main surface 12 of the substrate 2, the substrate 2 being formed from an insulating resin and having the first main surface 11 and the second main surface 12 that is on an opposite side of the first main surface 11.

The materials that form the substrate 2, the first conductor layer 21 and the second conductor layer 31 are the same as those described in the description of the light-emitting element mounting substrate and thus a description thereof is omitted.

(2) Positioning Hole Formation Process and Hole Formation Process

In a positioning hole formation process, at least two positioning holes that penetrate the first conductor layer, the substrate and the second conductor layer are formed in the double-sided conductor substrate.

The positioning hole formation process may be performed using punching, drilling, laser and the like, which are methods as methods for forming through-hole conductors.

Further, in a hole formation process, a hole penetrating the first conductor layer, the substrate and the second conductor layer is formed.

The hole formation process is preferably performed using punching.

And, it is preferable to simultaneously perform the positioning hole formation process and the hole formation process, and it is preferable to simultaneously perform both the positioning hole formation process and the hole formation process using punching.

In this case, it is preferable to use a punching device in which a positioning hole punch for forming a positioning hole and a metal block hole punch for forming a hole are fixed to the same die and a positional relation between the punches is fixed.

Figure 6B:
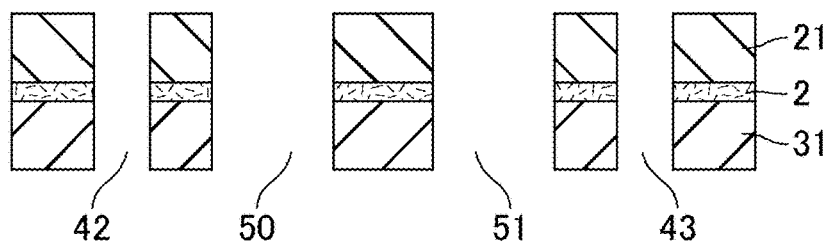

FIGS. 6A and 6B illustrate a process in which both the positioning hole formation process and the hole formation process are simultaneous performed by punching.

In this example, a positioning hole 42 and a positioning hole 43 are formed by punching from the first conductor layer 21 side using a positioning hole punch 92 and a positioning hole punch 93, and a hole 50 and a hole 51 are formed by punching using a metal block hole punch 90 and a metal block hole punch 91 for forming metal block insertion holes.

FIG. 6A illustrates a state in which the metal block hole punch 90, the metal block hole punch 91, the positioning hole punch 92 and the positioning hole punch 93 that are used in punching are fixed to the same die 95 and are formed on the first conductor layer 21 side.

FIG. 6B illustrates the double-sided conductor substrate in which the positioning hole 42, the positioning hole 43, the hole 50 and the hole 51 are formed.

At the time of punching, by making a diameter of a metal block hole punch larger than a diameter of a positioning hole punch, a hole having a larger diameter than a positioning hole is formed.

The diameter of a positioning hole corresponds to the diameter of a through-hole conductor and the diameter of a hole corresponds to the diameter of a metal block.

Examples of a top view shape of the hole include a substantially circular shape, a substantially elliptical shape, and a substantially polygonal shape (a substantially quadrangular shape, a substantially pentagonal shape, a substantially hexagonal shape, a substantially octagonal shape, and the like). A substantially quadrangular shape is preferable. Among substantially quadrangular shapes, a substantially rectangular shape and a substantially square shape are more preferable.

Further, examples of a top view shape of the positioning hole include a substantially circular shape, a substantially elliptical shape, and a substantially polygonal shape (a substantially quadrangular shape, a substantially pentagonal shape, a substantially hexagonal shape, a substantially octagonal shape, and the like). A substantially circular shape is preferable.

A substantially circular shape, a substantially elliptical shape, or a substantially polygonal shape, as the top view shape of a hole or a positioning hole, means that the shape is not limited to a circle, an ellipse, or a polygon in a strict sense. Substantially circular shapes include not only a circle but also a shape formed by slightly distorting a circle. Substantially polygonal shapes also include a polygonal shape of which corners are slightly rounded. Further, substantially rectangular or substantially square shapes include, in addition to strict rectangular or square shapes, also shapes having sides slightly different in length and angle.

A method for determining the diameter of the hole or the diameter of the positioning hole is the same as the method for determining the diameter of each of the metal blocks or the diameter of each of the through-hole conductors, and the diameter is determined based on a shape viewed from above. A specific diameter determination method differs depending on the top view shape.

When the top view shape is a circular or substantially circular shape, the diameter is determined based on a diameter of the circular or substantially circular shape. When the top view shape is an elliptical or substantially elliptical shape, the diameter of each of the metal blocks or the diameter of each of the through-hole conductors is determined based on a long diameter of the elliptical or substantially elliptical shape.

When the top view shape is a polygonal or substantially polygonal shape, the diameter of each of the metal blocks or the diameter of each of the through-hole conductors is determined based on a length of a longest diagonal line of the polygonal or substantially polygonal shape.

A ratio of the diameter of the hole to the diameter of the positioning hole ((the diameter of the hole)/(the diameter of the positioning hole)) is preferably 1.5-7.5, and is more preferably 2.5-5.5.

Further, the diameter of the positioning hole is preferably 0.2-1.0 mm.

Further, the diameter of the hole is preferably 0.3-4.0 mm.

(3) Metal Block Insertion Process

In a metal block insertion process, with the at least two positioning holes that are formed in the above process as references, metal blocks are respectively inserted into the holes and embedded in the holes.

By respectively inserting the metal blocks into the holes with the positioning holes as references, the positional relation between the positioning holes and the metal blocks is accurately determined. By respectively inserting the metal blocks into the holes and forming the through-hole conductors in the positioning holes, a light-emitting element mounting substrate in which the positional relation between the metal blocks and the through-hole conductors is accurately determined may be manufactured.

Further, by incorporating the positioning holes as a part of the light-emitting element mounting substrate and using the positioning holes as through-hole conductors, it is not necessary to additionally secure places for the positioning holes in a substrate as a raw material, and thus the number of light-emitting element mounting substrates formed from the substrate as a raw material may be increased.

Figure 6C:
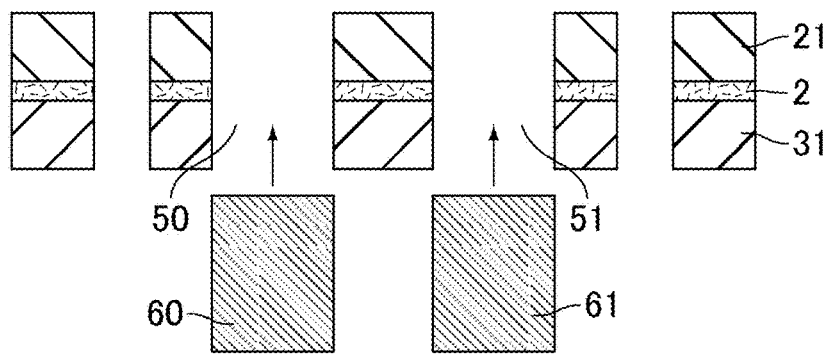

FIG. 6C illustrates a process in which the metal block 60 and the metal block 61 are respectively inserted into the hole 50 and the hole 51 from the second conductor layer 31 side.

When the metal blocks are respectively inserted into the holes, it is preferable that the metal blocks be respectively inserted into the holes from the side opposite to the side where punching in the hole formation process is performed. When punching is performed from the first conductor layer side, it is preferable that the metal blocks be respectively inserted into the holes from the second conductor layer side, and when punching is performed from the second conductor layer side, it is preferable that the metal blocks be respectively inserted into the holes from the first conductor layer side. This is preferable because the substrate is prevented from being bent.

(4) Metal Plating Process

Figure 6D:
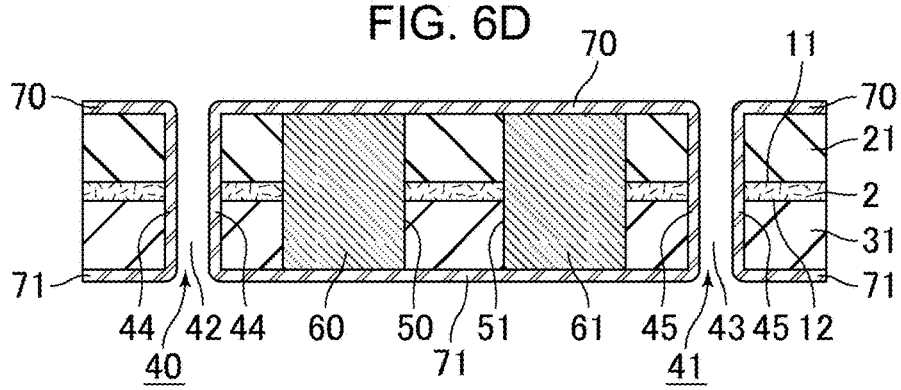

As illustrated in FIG. 6D, metal plating is performed, and a through-hole plating 44 and a through-hole plating 45 are respectively formed on a wall surface of the positioning hole 42 and on a wall surface of the positioning hole 43. As a result, a through-hole conductor 40 and a through-hole conductor 41 that electrically connect the first conductor layer and the second conductor layer are formed.

As a method of metal plating, a method for forming through-hole conductors may be used. A method or the like, in which electroless copper plating is performed and thereafter electrolytic copper plating is performed, may be applied.

Further, by the metal plating process, a metal plating layer 70 is formed so as to cover surfaces of the metal blocks on the first conductor layer side and a surface of the first conductor layer and a metal plating layer 71 is formed so as to cover surfaces of the metal blocks on the second conductor layer side and a surface of the second conductor layer.

The formation of the through-hole conductors and the formation of the metal plating layers may be performed in the same metal plating process or in separate processes.

Further, when outermost surfaces of the metal plating layers are formed of at least one metal selected from a group of nickel and silver, it is preferable to perform a nickel and/or silver plating process.

By making each of the outermost surfaces of the metal plating layers a nickel plating layer, when a gold plating layer is formed in a subsequent process, connectivity between the first conductor layer and the gold plating layer may be improved by the nickel plating layer.

It is preferable to further perform other processes such as a pattern formation process, a pressing process, a coining process, a gold plating process and a light-reflecting layer formation process, when necessary.

(5) Pattern Formation Process

Figure 7A:
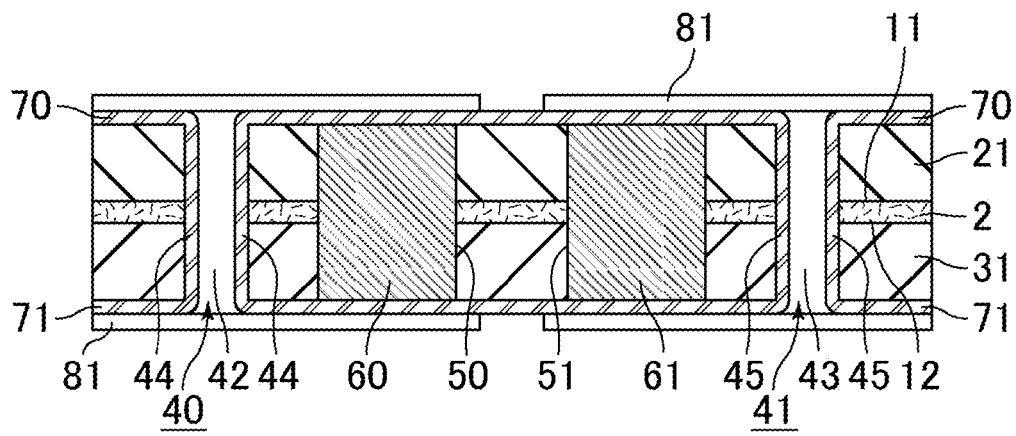
FIG. 7A-7C are process diagrams schematically illustrating an example of a pattern formation process according to an embodiment of the present invention.
Figure 7B:
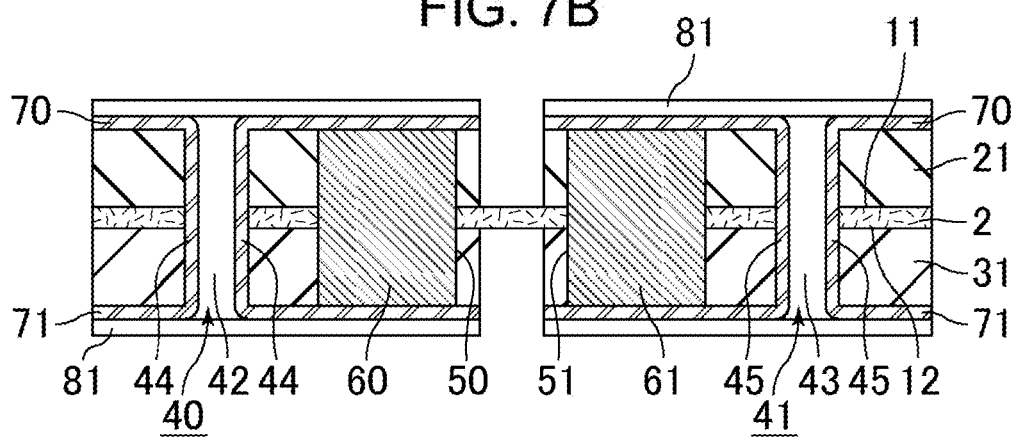
Figure 7C:
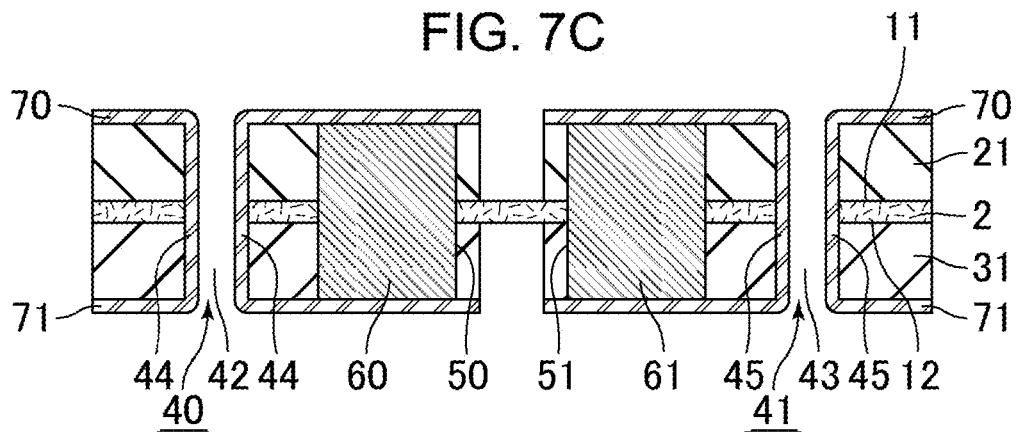

FIG. 7A-7C are process diagrams schematically illustrating an example of a pattern formation process.

In the pattern formation process, as illustrated in FIG. 7A, an etching resist 81 is formed on the surface of the first conductor layer 21, the surface of the metal block 60, the surface of the metal block 61, and the surface of the second conductor layer 31.

Next, as illustrated in FIG. 7B, portions of the metal plating layer 70, the first conductor layer 21, the second conductor layer 31 and the metal plating layer 71 in a place where the etching resist 81 is not formed are removed by etching.

Thereafter, as illustrated in FIG. 7C, the etching resist 81 is removed. Any pattern may be formed using such a method.

In the pattern formation process, in order to ensure insulation between mounting pads of the light-emitting element mounting substrate, it is preferable to remove a portion of each of the conductor layers by etching.

As an etching solution, for example, a sulfuric acid—hydrogen peroxide aqueous solution, a persulfate aqueous solution such as ammonium persulfate, ferric chloride, cupric chloride, hydrochloric acid and the like may be used. Further, as the etching solution, a mixed solution containing a cupric complex and an organic acid may also be used.

(6) Pressing Process

It is preferable to control a position of the surfaces of the metal blocks relative to the surface of the first conductor layer by pressing the light-emitting element mounting substrate using a mold having a predetermined shape. By pressing, front end portions of the surfaces of the metal blocks on the first conductor layer side become flat surfaces.

(7) Coining Process

It is preferable to perform coining in order to improve flatness of the surface of the first conductor layer and the surfaces of the metal blocks on the first conductor layer side.

When the flatness of the surface of the first conductor layer and the surfaces of the metal blocks on the first conductor layer side is improved by coining, mountability of light-emitting elements may be improved. Further, when the flatness of the surface of the first conductor layer and the surfaces of the metal blocks on the first conductor layer side is high, optical axes in the case where light-emitting elements are mounted are aligned and brightness is improved.

(8) Gold Plating Process

Figure 8:
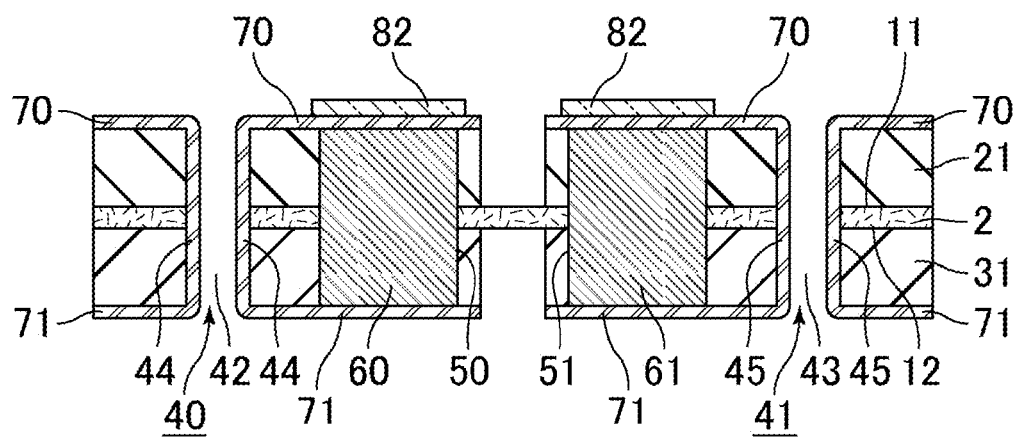
FIG. 8 is a process diagram schematically illustrating a gold plating process according to an embodiment of the present invention.

FIG. 8 is a process diagram schematically illustrating a gold plating process.

In a portion that becomes a mounting pad on the surface of the metal block 60 on the first conductor layer 21 side, a gold plating layer 82 is formed on the metal plating layer 70, and a mounting pad having a gold layer formed on an outermost surface thereof is formed.

When a nickel plating layer is formed on the outermost surface of the metal plating layer, an oxide film occurs on a surface of the nickel plating layer, and electrical connection between the mounting pad and an electrode of the light-emitting element is likely to deteriorate.

Therefore, by having a mounting pad that has a gold layer formed on an outermost surface thereof, connectivity between the mounting pad and the electrode of the light-emitting element is improved.

Removal of the nickel oxide film may be performed using an ordinary nickel oxide film removing agent. A reagent may be used as the nickel oxide film removing agent.

Further, it is preferable that gold plating be performed using an electroless gold plating solution.

(9) Light-Reflecting Layer Formation Process

Figure 9:
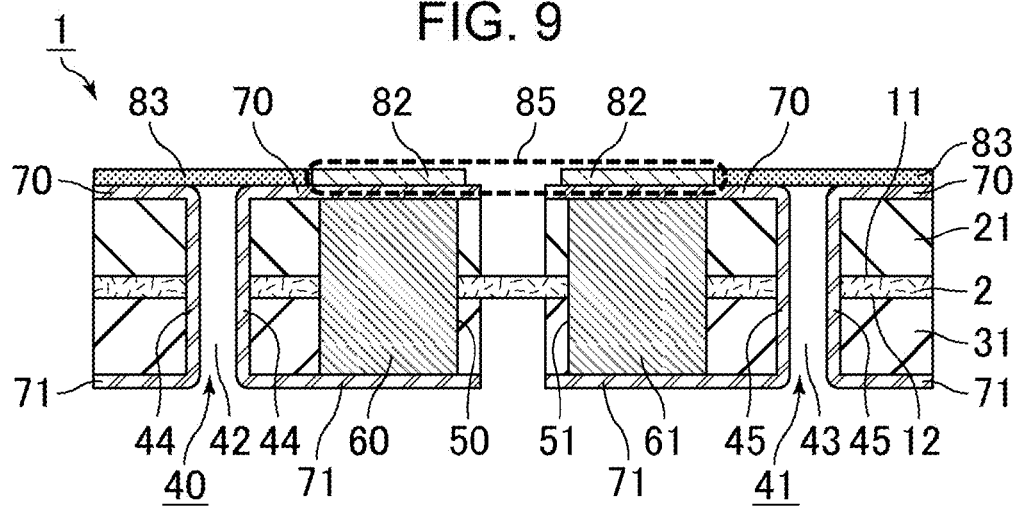
FIG. 9 is a process diagram schematically illustrating a light-reflecting layer formation process according to an embodiment of the present invention.

FIG. 9 is a process diagram schematically illustrating a light-reflecting layer formation process.

As illustrated in FIG. 9, a light-reflecting layer 83 is formed at a position of the outermost surface on the first conductor layer 21 side such that an element mounting part 85 (the gold plating layer 82) is exposed.

By the above-described processes, the light-emitting element mounting substrate 1 illustrated in FIG. 1 is manufactured.

By connecting electrodes of a light-emitting element 7 to the mounting pads of the light-emitting element mounting substrate 1, the light-emitting element is mounted, and a light-emitting device in a state illustrated in FIG. 3 is obtained.

When the light-reflecting layer is formed, it is desirable that the light-reflecting layer be formed using a material that contains titanium oxide as a pigment and allows the formed light-reflecting layer to become an insulating layer.

Further, it is desirable that the light-reflecting layer be formed to become a solder resist layer.

Titanium oxide is a white pigment. The light-reflecting layer containing titanium oxide suitably reflects light.

When the light-reflecting layer is a solder resist layer containing titanium oxide as a pigment, in addition to the above-described effect, the light-reflecting layer also functions as a solder resist at the same time.

The light-emitting element mounting substrate in Japanese Patent Laid-Open Publication No. 2005-166937 has a through hole that connects an element mounting surface, on which a light-emitting element is mounted, and a back surface that is on an opposite side of the element mounting surface. The through hole is filled with plating to form a filled via, which functions as a path for dissipating heat of the light-emitting element to the back surface of the light-emitting element mounting substrate. Further, due to the through hole, the element mounting surface and the back surface of the substrate are electrically connected.

Although the light-emitting element mounting substrate of Japanese Patent Laid-Open Publication No. 2005-166937 has the through hole as a path for dissipating heat to the back surface of the light-emitting element mounting substrate, heat dissipation via the through hole is insufficient in heat dissipation performance, and a substrate having a structure that is excellent in heat dissipation performance is further desired.

A light-emitting element mounting substrate according to an embodiment of the present invention ensures electrical connection between front and back sides of the substrate and is excellent in heat dissipation performance, and a method according to an embodiment of the present invention manufactures the light-emitting element mounting substrate.

A light-emitting element mounting substrate according to an embodiment of the present invention includes: a substrate that is formed from an insulating resin and has a first main surface and a second main surface that is on an opposite side of the first main surface; a first conductor layer that is formed on the first main surface of the substrate; a second conductor layer that is formed on the second main surface of the substrate; an element mounting part that is formed on the first conductor layer side; and metal blocks that penetrate the first conductor layer, the substrate and the second conductor layer. Multiple metal blocks are provided with respect to one element mounting part. Through-hole conductors that are respectively adjacent to the metal blocks and electrically connect the first conductor layer and the second conductor layer are provided. A diameter of each of the metal blocks is larger than a diameter of each of the through-hole conductors.

A method for manufacturing a light-emitting element mounting substrate according to an embodiment of the present invention includes: a double-sided conductor substrate preparation process in which a double-sided conductor substrate is prepared, the double-sided conductor substrate including: a substrate that is formed from an insulating resin and has a first main surface and a second main surface that is on an opposite side of the first main surface; a first conductor layer that is formed on the first main surface of the substrate; and a second conductor layer that is formed on the second main surface of the substrate; a positioning hole formation process in which at least two positioning holes are formed in the double-sided conductor substrate, the positioning holes penetrating the first conductor layer, the substrate and the second conductor layer; a hole formation process in which holes each having a diameter larger than that of each of the positioning holes are formed, the holes penetrating the first conductor layer, the substrate and the second conductor layer; a metal block insertion process in which metal blocks are respectively inserted into the holes and filled in the holes using the at least two positioning holes as reference positions; and a metal plating process in which, by metal plating, the positioning holes become through-hole conductors that electrically connect the first conductor layer and the second conductor layer.

Obviously, numerous modifications and variations of the present invention are possible in light of the above teachings. It is therefore to be understood that within the scope of the appended claims, the invention may be practiced otherwise than as specifically described herein.

The invention claimed is:

1. A light-emitting element mounting substrate, comprising:
   a substrate comprising insulating resin;
   a first conductor layer formed on a first surface of the substrate and having an element mounting portion;
   a second conductor layer formed on a second surface of the substrate on an opposite side of the first surface;
   a plurality of metal blocks formed such that the plurality of metal blocks is penetrating through the first conductor layer, the substrate and the second conductor layer and positioned in the element mounting portion of the first conductor layer; and
   a plurality of through-hole conductors formed adjacent to the plurality of metal blocks respectively such that the plurality of through-hole conductors electrically connects the first conductor layer and the second conductor layer and that a diameter of each metal block is larger than a diameter of each through-hole conductor, wherein the first conductor layer is formed such that when a light-emitting element is mounted on the element mounting portion, the plurality of metal blocks is positioned directly below the light-emitting element on the element mounting portion, each of the metal blocks has an end surface in a rectangular shape such that the diameter of each metal block is a diagonal length of the end surface in the rectangular shape, each of the through-hole conductors has an end surface in a circular shape such that the diameter of each through-hole conductor is a diameter of the end surface in the circular shape, the plurality of metal blocks and the plurality of through-hole conductors are formed such that a ratio of the diameter of the metal blocks to the diameter of the through-hole conductors is in a range of 1.5 to 7.5, the plurality of through-hole conductors is formed such that the diameter of the through-hole conductors is in a range of 0.2 mm to 1.0 mm, and the plurality of metal blocks is formed such that the diameter of the metal blocks is in a range of 0.3 mm to 4.0 mm.

2. A light-emitting element mounting substrate according to claim 1, wherein the plurality of metal blocks and the plurality of through-hole conductors are formed such that each of the metal blocks has a same potential with respect to an adjacent one of the through-hole conductors.

3. A light-emitting element mounting substrate according to claim 1, wherein the plurality of through-hole conductors is formed such that the plurality of through-hole conductors forms a plurality of positioning holes formed to position the plurality of metal blocks.

4. A light-emitting element mounting substrate according to claim 1, wherein the plurality of metal blocks and the plurality of through-hole conductors are formed such that a conductor volume ratio of a conductor volume of each metal block to a conductor volume of each through-hole conductor is 10 or greater.

5. A light-emitting element mounting substrate according to claim 1, wherein the first conductor layer is formed such that the element mounting portion is formed in a plurality, that the plurality of metal blocks is formed at each element mounting portion, and that one of the through-hole conductors is formed between one element mounting portion and an adjacent element mounting portion and another one of the through-hole conductors is formed between the one element mounting portion and another adjacent element mounting portion.

6. A light-emitting element mounting substrate according to claim 1, further comprising:
a metal plating layer formed on a surface of the first conductor layer and end surface of the metal blocks on a first conductor layer side.

7. A light-emitting element mounting substrate according to claim 1, further comprising:
a light-reflecting layer forming an outermost surface on a first conductor layer side such that the light-reflecting layer is exposing the element mounting portion of the first conductor layer.

8. A light-emitting element mounting substrate according to claim 6, wherein the plurality of metal blocks and the plurality of through-hole conductors are formed such that each of the metal blocks has a same potential with respect to an adjacent one of the through-hole conductors.

9. A light-emitting element mounting substrate according to claim 6, wherein the plurality of through-hole conductors is formed such that the plurality of through-hole conductors forms a plurality of positioning holes formed to position the plurality of metal blocks.

10. A light-emitting element mounting substrate according to claim 2, wherein the plurality of through-hole conductors is formed such that the plurality of through-hole conductors forms a plurality of positioning holes formed to position the plurality of metal blocks.

11. A light-emitting element mounting substrate according to claim 2, wherein the plurality of metal blocks and the plurality of through-hole conductors are formed such that a conductor volume ratio of a conductor volume of each metal block to a conductor volume of each through-hole conductor is 10 or greater.

12. A light-emitting element mounting substrate according to claim 2, wherein the first conductor layer is formed such that the element mounting portion is formed in a plurality, that the plurality of metal blocks is formed at each element mounting portion, and that one of the through-hole conductors is formed between one element mounting portion and an adjacent element mounting portion and another one of the through-hole conductors is formed between the one element mounting portion and another adjacent element mounting portion.

13. A light-emitting element mounting substrate according to claim 3, wherein the plurality of metal blocks and the plurality of through-hole conductors are formed such that a conductor volume ratio of a conductor volume of each metal block to a conductor volume of each through-hole conductor is 10 or greater.

14. A light-emitting element mounting substrate according to claim 3, wherein the first conductor layer is formed such that the element mounting portion is formed in a plurality, that the plurality of metal blocks is formed at each element mounting portion, and that one of the through-hole conductors is formed between one element mounting portion and an adjacent element mounting portion and another one of the through-hole conductors is formed between the one element mounting portion and another adjacent element mounting portion.

15. A light-emitting element mounting substrate according to claim 4, further comprising:
a metal plating layer formed on a surface of the first conductor layer and end surface of the metal blocks on a first conductor layer side.

16. A light-emitting element mounting substrate according to claim 5, further comprising:
a metal plating layer formed on a surface of the first conductor layer and end surface of the metal blocks on a first conductor layer side.

17. A light-emitting element mounting substrate according to claim 6, further comprising:
a light-reflecting layer forming an outermost surface on a first conductor layer side such that the light-reflecting layer is exposing the element mounting portion of the first conductor layer.

18. A method for manufacturing a light-emitting element mounting substrate, comprising:
preparing a double-sided conductor substrate comprising a substrate comprising insulating resin, a first conductor layer formed on a first surface of the substrate, and a second conductor layer formed on a second surface of the substrate on an opposite side of the first surface;
forming a plurality of positioning holes in the double-sided conductor substrate such that each of the positioning holes penetrates through the first conductor layer, the substrate and the second conductor layer;

forming a plurality of holes in an element mounting portion of the first conductor layer such that each of the holes penetrates through the first conductor layer, the substrate and the second conductor layer and has a diameter that is larger than a diameter of each positioning hole;

inserting a plurality of metal blocks into the plurality of holes respectively using the positioning holes as reference positions such that the metal blocks fill in the holes in the element mounting portion of the first conductor layer; and applying metal plating to the positioning holes such that a plurality of through-hole conductors is formed in the plurality of positioning holes respectively and electrically connects the first conductor layer and the second conductor layer, wherein the first conductor layer is formed such that when a light-emitting element is mounted on the element mounting portion, the plurality of metal blocks is positioned directly below the light-emitting element on the element mounting portion, each of the metal blocks has an end surface in a rectangular shape such that the diameter of each metal block is a diagonal length of the end surface in the rectangular shape, each of the through-hole conductors has an end surface in a circular shape such that the diameter of each through-hole conductor is a diameter of the end surface in the circular shape, the plurality of metal blocks and the plurality of through-hole conductors are formed such that a ratio of the diameter of the metal blocks to the diameter of the through-hole conductors is in a range of 1.5 to 7.5, the plurality of through-hole conductors is formed such that the diameter of the through-hole conductors is in a range of 0.2 mm to 1.0 mm, and the plurality of metal blocks is formed such that the diameter of the metal blocks is in a range of 0.3 mm to 4.0 mm.

19. A method for manufacturing a light-emitting element mounting substrate according to claim 18, wherein the forming of the positioning holes and the forming of the holes are conducted simultaneously in a same process.

20. A method for manufacturing a light-emitting element mounting substrate according to claim 18, wherein the forming of the holes comprises punching the plurality of holes through the double-sided conductor substrate, and the inserting of the metal blocks comprises inserting the metal blocks into the holes from a surface of the double-sided conductor substrate on an opposite side with respect to a surface of the double-sided conductor substrate upon which the punching of the holes is applied.

* * * * *